United States Patent
Demircin et al.

(10) Patent No.: US 7,932,843 B2
(45) Date of Patent: Apr. 26, 2011

(54) PARALLEL CABAC DECODING FOR VIDEO DECOMPRESSION

(75) Inventors: Mehmet Umut Demircin, Dallas, TX (US); Vivienne Sze, Toronto (CA); Madhukar Budagavi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/572,217

(22) Filed: Oct. 1, 2009

(65) Prior Publication Data

US 2010/0097250 A1   Apr. 22, 2010

Related U.S. Application Data

(60) Provisional application No. 61/106,323, filed on Oct. 17, 2008.

(51) Int. Cl.
*H03M 7/00* (2006.01)
(52) U.S. Cl. .......................... 341/107; 341/50
(58) Field of Classification Search ............... 341/107, 341/51, 50, 106
See application file for complete search history.

(56) References Cited

U.S. PATENT DOCUMENTS

| | | | |
|---|---|---|---|
| 7,522,076 B1 * | 4/2009 | Hsu et al. ................. | 341/107 |
| 7,525,459 B2 * | 4/2009 | Stein et al. ................ | 341/106 |
| 2009/0079602 A1 | 3/2009 | Sze et al. | |
| 2009/0196355 A1 * | 8/2009 | Kao et al. ................. | 375/240.25 |
| 2009/0219183 A1 * | 9/2009 | Sakaguchi ................. | 341/107 |
| 2009/0304075 A1 * | 12/2009 | Ogura et al. .............. | 375/240.12 |

OTHER PUBLICATIONS

Detlev Marpe, et al., "Context-Based Adaptive Binary Arithmetic Coding in the H.264/AVC Video Compression Standard," IEEE Transactions on Circuits and Systems for Video Technology, vol. 13, No. 7. Jul. 2003, pp. 1-17.

ITU-T Telecommunication Standardization Sector of ITU, "Series H: Audiovisual and Multimedia Systems, Infrastructure of Audiovisual Services—Coding of Moving Video; Advanced Video Coding for Generic Audiovisual Services", ITU-T Recommendation H.264, Mar. 2005, pp. 1-343.

Vivienne Sze, et al., "Parallel CABAC for Low Power Video Coding," Proc. IEEE International Conference on Image Processing, San Diego, CA, Oct. 12-15, 2008, pp. 2096-2099.

* cited by examiner

*Primary Examiner* — Peguy JeanPierre
(74) *Attorney, Agent, or Firm* — Mirna G. Abyad; Wade J. Brady III; Frederick J. Telecky, Jr

(57) ABSTRACT

A method of video decoding is provided that includes receiving a data stream comprising a sequence of syntax elements that were compressed using context-adaptive binary arithmetic coding (CABAC), such that the encoding of each bin of a bin string representative of a syntax element was performed by arithmetic encoding. Two consecutive bins of a syntax element are decoded in parallel. Speculative computation and prefetching is used to reduce the critical path and thereby improve processing speed.

19 Claims, 10 Drawing Sheets

PARALLEL CABAC DECODING FOR VIDEO DECOMPRESSION

CLAIM OF PRIORITY UNDER 35 U.S.C. 119(e)

The present application claims priority to U.S. Provisional Patent Application No. 61/106,323, entitled "Method and Apparatus for Video Processing in Context-Adaptive Binary Arithmetic Coding," was filed Oct. 17, 2008 and is incorporated by reference herein in its entirety.

BACKGROUND OF THE INVENTION

The demand for digital video products continues to increase. Some examples of applications for digital video include video communication, security and surveillance, industrial automation, and entertainment (e.g., DV, HDTV, satellite TV, set-top boxes, Internet video streaming, digital cameras, video jukeboxes, high-end displays and personal video recorders). Further, video applications are becoming increasingly mobile as a result of higher computation power in handsets, advances in battery technology, and high-speed wireless connectivity.

Video compression and decompression is an essential enabler for digital video products. Compression-decompression (CODEC) algorithms enable storage and transmission of digital video. Typically codecs are industry standards such as MPEG-2, MPEG-4, H.264/AVC, etc. At the core of all of these standards is the hybrid video coding technique of block motion compensation (prediction) plus transform coding of prediction error. Block motion compensation is used to remove temporal redundancy between successive pictures (frames or fields) by prediction from prior pictures, whereas transform coding is used to remove spatial redundancy within each block.

Many block motion compensation schemes basically assume that between successive pictures, i.e., frames, in a video sequence, an object in a scene undergoes a displacement in the x- and y-directions and these displacements define the components of a motion vector. Thus, an object in one picture can be predicted from the object in a prior picture by using the motion vector of the object. To track visual differences from frame-to-frame, each frame is tiled into blocks often referred to as macroblocks. Block-based motion estimation algorithms are used to generate a set of vectors to describe block motion flow between frames, thereby constructing a motion-compensated prediction of a frame. The vectors are determined using block-matching procedures that try to identify the most similar blocks in the current frame with those that have already been encoded in prior frames.

Context-adaptive binary arithmetic coding (CABAC) is a form of entropy coding used in H.264/MPEG-4 AVC video encoding. As such it is an inherently lossless compression technique. It is notable for providing considerably better compression than most other encoding algorithms used in video encoding and is considered one of the primary advantages of the H.264/AVC encoding scheme. CABAC is only supported in Main and higher profiles and requires a considerable amount of processing to decode compared to other similar algorithms. As a result, Context-adaptive variable-length coding (CAVLC), a lower efficiency entropy encoding scheme, is sometimes used instead to increase performance on slower playback devices. CABAC achieves 9%-14% better compression compared to CAVLC, with the cost of increased complexity.

The theory and operation of CABAC encoding for H.264 is fully defined in the International Telecommunication Union, Telecommunication Standardization Sector (ITU-T) standard "Advanced video coding for generic audiovisual services" H.264, revision March 2005 or later. General principles are explained in detail in "Context-Based Adaptive Binary Arithmetic Coding in the H.264/AVC Video Compression Standard" Detlev Marpe, July 2003. In brief, CABAC has multiple probability modes for different contexts. It first converts all non-binary symbols to binary. Then, for each bit, the coder selects which probability model to use, then uses information from nearby elements to optimize the probability estimate. Arithmetic coding is then applied to compress the data.

Efficient coding of syntax-element values in a hybrid block-based video coder, such as components of motion vector differences or transform-coefficient level values, can be achieved by employing a binarization scheme as a kind of preprocessing unit for the subsequent stages of context modeling and binary arithmetic coding. In general, a binarization scheme defines a unique mapping of syntax element values to sequences of binary decisions, so-called bins, which can also be interpreted in terms of a binary code tree. The sequence of binary decisions may be referred to as a bin string, or other similar terms.

By decomposing each syntax element value into a sequence of bins, further processing of each bin value in CABAC depends on the associated coding-mode decision which can be either the regular or the bypass mode. Bypass mode is typically used for bins that are assumed to be uniformly distributed. In the regular coding mode, each bin value is encoded by using the regular binary arithmetic-coding engine, where the associated probability model is either determined by a fixed choice, without any context modeling, or adaptively chosen depending on a related context model. Context models are identified using a context index that is selected from 460 possible values (except High 4:4:4 Intra and High 4:4:4 Predictive profiles).

For bypass mode, complexity of the arithmetic coding is significantly reduced. For regular arithmetic coding, encoding of the given bin value depends on the actual state of the associated adaptive probability model that is passed along with the bin value to the multiplication-free Modulo (M) coder, which is a table-based binary arithmetic coding engine used in CABAC. Probability estimation in CABAC is based on a table-driven estimator in which each probability model can take one of 64 different states with associated probability values p ranging in the interval 0.0-0.5 The distinction between the least probable symbol (LPS) and the most probable symbol (MPS) allows each state to be specified by means of the corresponding LPS-related probability, pLPS, and the MPS.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1:
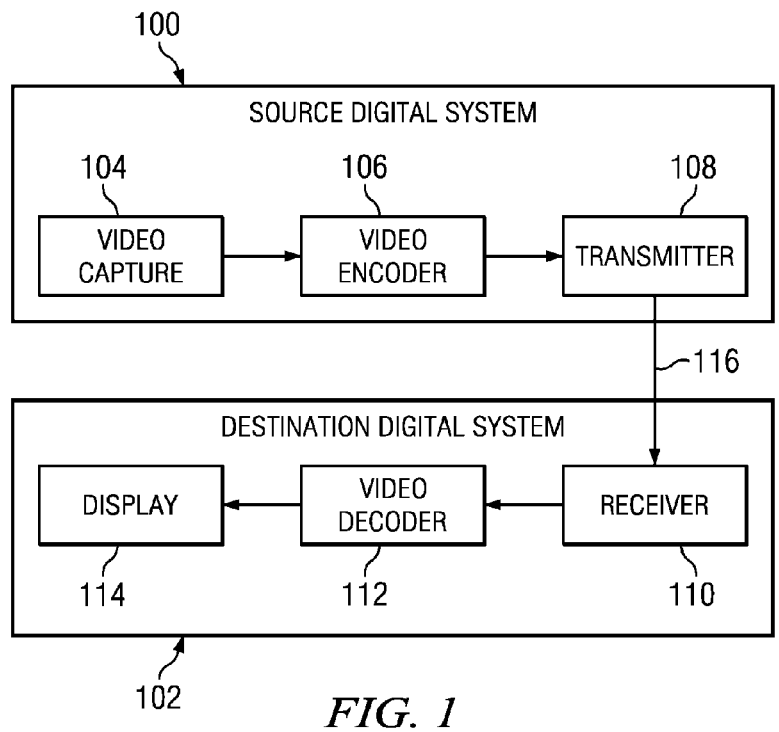
FIG. 1 shows a block diagram of a video encoding/decoding system in accordance with one or more embodiments of the invention.

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. Further, while various embodiments of the invention are described herein in accordance with the H.264 video coding standard, embodiments for other video coding standards will be understood by one of ordinary skill in the art. Accordingly, embodiments of the invention should not be considered limited to the H.264 video coding standard.

In the description herein, some terminology is used that is specifically defined in the H.264 video coding standard and/or is well understood by those of ordinary skill in the art in CABAC coding. Definitions of these terms are not provided in the interest of brevity. Further, this terminology is used for convenience of explanation and should not be considered as limiting embodiments of the invention to the H.264 standard. One of ordinary skill in the art will appreciate that different terminology may be used in other video encoding standards without departing from the described functionality.

The existing H.264 Context Adaptive Binary Arithmetic Coding (CABAC) decoding implementations have limited throughput due to the fact that only one binary symbol (bin) can be decoded per cycle. Consequently, in order to decode high bit-rate video bit-streams in real-time, a CABAC decoding engine needs to be run at extremely high frequencies which consumes a significant amount of power and in the worst case may not be feasible. Note that issues similar to this exist in other standards such as SVC, MVC, China AVS, etc. and can also be addressed by embodiments of this invention.

Currently, hardware decoder engines are able to decode one binary symbol per cycle. Thus, in order to decode a 720p60 video data stream, the decoder must operate at approximately 250 M cycles per second. For higher quality video images, such as 1080p60, the required decoding rate is approximately 1100M cycles per second. It may be difficult to design a hardware decoder that operates at this frequency.

Embodiments of the invention provide an arithmetic decoding engine that can decode two binary symbols (bins) per cycle. In this manner, it can be used to reduce the clock frequency requirements and increase the throughput of the video decoder hardware. Various embodiments of the invention include one or more techniques to reduce the critical path delay of the two bins per cycle engine implementation. Instead of decoding two bins sequentially in a single cycle, the methods described herein perform parallelization and speed improvements for two bins/cycle CABAC engine blocks.

FIG. 1 shows a block diagram of a video encoding/decoding system in accordance with one or more embodiments of the invention. The video encoding/decoding system performs encoding of digital video sequences using known implementations of the H.264 standard. The system includes a source digital system (100) that transmits encoded video sequences to a destination digital system (102) via a communication channel (116). The source digital system (100) includes a video capture component (104), a video encoder component (106) and a transmitter component (108). The video capture component (104) is configured to provide a video sequence to be encoded by the video encoder component (106). The video capture component (104) may be for example, a video camera, a video archive, or a video feed from a video content provider. The video capture component (104) may generate computer graphics as the video sequence, or a combination of live video and computer-generated video.

The video encoder component (106) receives a video sequence from the video capture component (104) and encodes it for transmission by the transmitter component (108). In general, the video encoder component (106) receives the video sequence from the video capture component (104) as a sequence of video frames, divides the frames into coding units which may be a whole frame or a slice of a frame, divides the coding units into blocks of pixels, and encodes the video data in the coding units based on these blocks, as described above in accordance with the H.264 standard.

The transmitter component (108) transmits the encoded video data to the destination digital system (102) via the communication channel (116). The communication channel (116) may be any communication medium, or combination of communication media suitable for transmission of the encoded video sequence, such as, for example, wired or wireless communication media, a local area network, or a wide area network. The video capture and encoding may take place at a different location and time than the transmission. For example, television programs and movies may be produced, encoded and stored on a disc or other storage devices. The stored movie or program may then be transmitted at a later time.

The destination digital system (102) includes a receiver component (110), a video decoder component (112) and a display component (114). The receiver component (110) receives the encoded video data from the source digital system (100) via the communication channel (116) and provides the encoded video data to the video decoder component (112) for decoding. In general, the video decoder component (112) reverses the encoding process performed by the video encoder component (106) to reconstruct the frames of the video sequence. As will be described in more detail below, the decoder component includes an embodiment of a parallel decoder engine so that two bins may be decoded in parallel. The reconstructed video sequence may then be displayed on the display component (114). The display component (114) may be any suitable display device such as, for example, a plasma display, a liquid crystal display (LCD), a light emitting diode (LED) display, etc.

In some embodiments of the invention, the source digital system (100) may also include a receiver component and a video decoder component and/or the destination digital system (102) may include a transmitter component and a video encoder component for transmission of video sequences both directions for video steaming, video broadcasting, and video telephony. Further, the video encoder component (106) and the video decoder component (112) perform encoding and decoding in accordance with a video compression standard such as, for example, the Moving Picture Experts Group (MPEG) video compression standards, e.g., MPEG-1, MPEG-2, and MPEG-4, the ITU-T video compressions standards, e.g., H.263 and H.264, the Society of Motion Picture and Television Engineers (SMPTE) 421 M video CODEC standard (commonly referred to as "VC-1"), the video compression standard defined by the Audio Video Coding Standard Workgroup of China (commonly referred to as "AVS"), etc. The video encoder component (106) and the video decoder component (112) may be implemented in any suitable combination of software, firmware, and hardware, such as, for example, one or more digital signal processors (DSPs), microprocessors, discrete logic, application specific integrated circuits (ASICs), etc.

Figure 2:
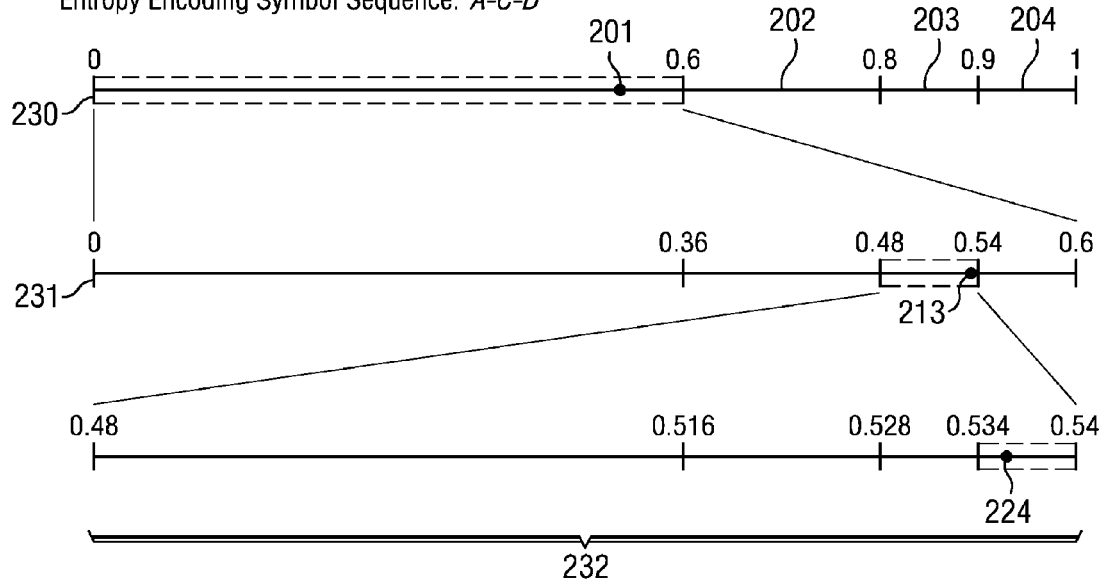
FIG. 2 is an illustration of encoding a sequence of an exemplary 4-symbol alphabet.

In order to better understand the process of arithmetic encoding and parallel bin decoding, FIG. 2 is an illustration of encoding a sequence "A-C-D" of an exemplary 4-symbol alphabet. In this example, symbol A has a probability of occurrence of 0.6, B has a probability of occurrence of 0.2, and symbol C and D both have a probability of occurrence of 0.1. Initially, range 230 extends from 0.0 to 1.0 and with all four symbols 201-203 mapped onto the total range of 0.0-1.0. Thus, by transmitting any value between 0.0 and 0.6 as indicated at 201, and knowing the range is 0.0-1.0, a decoder could determine that symbol "A" was transmitted, for example. In order to encode the sequence "A-C-D", the probabilities are effectively multiplied together. In this case, since the first symbol is A 201, its probability 0.6 is expanded (normalized) to full range 231 and the symbol alphabet is again mapped onto the normalized range 231. The 'C" position 213 now covers a portion 0.48-0.54 of range 231 that has a value of 0.0-0.6. This range is normalized at 232 and the symbol alphabet is again mapped by effectively multiplying the individual probabilities. Symbol "D" occupies a portion 0.534-0.54 of range 232 that has a value of 0.48-0.54. Thus, any value between 0.534-0.54 within this range can be transmitted and the decoder can recover the original sequence by reversing the process and sequentially renormalizing the range as each symbol is determined.

This process can be extended for dozens or thousands of symbols. As long as the decoder knows the final range, the probabilities of the symbols and a value within the range, the decoder can incrementally reverse the process to recover the entire sequence of symbols. In order to decode two symbols in parallel, as the chain is traversed in reverse order, all possible outcomes of a next symbol at each stage must be speculatively processed in parallel until the value of the proceeding symbol is determined. Once the proceeding symbol is determined, then the next symbol can be selected from the results of the speculative parallel operations, such that two symbols are effectively decoded in parallel per cycle, as will be explained in more detail below. Within CABAC, the probability profile is defined by the context.

Figure 3:
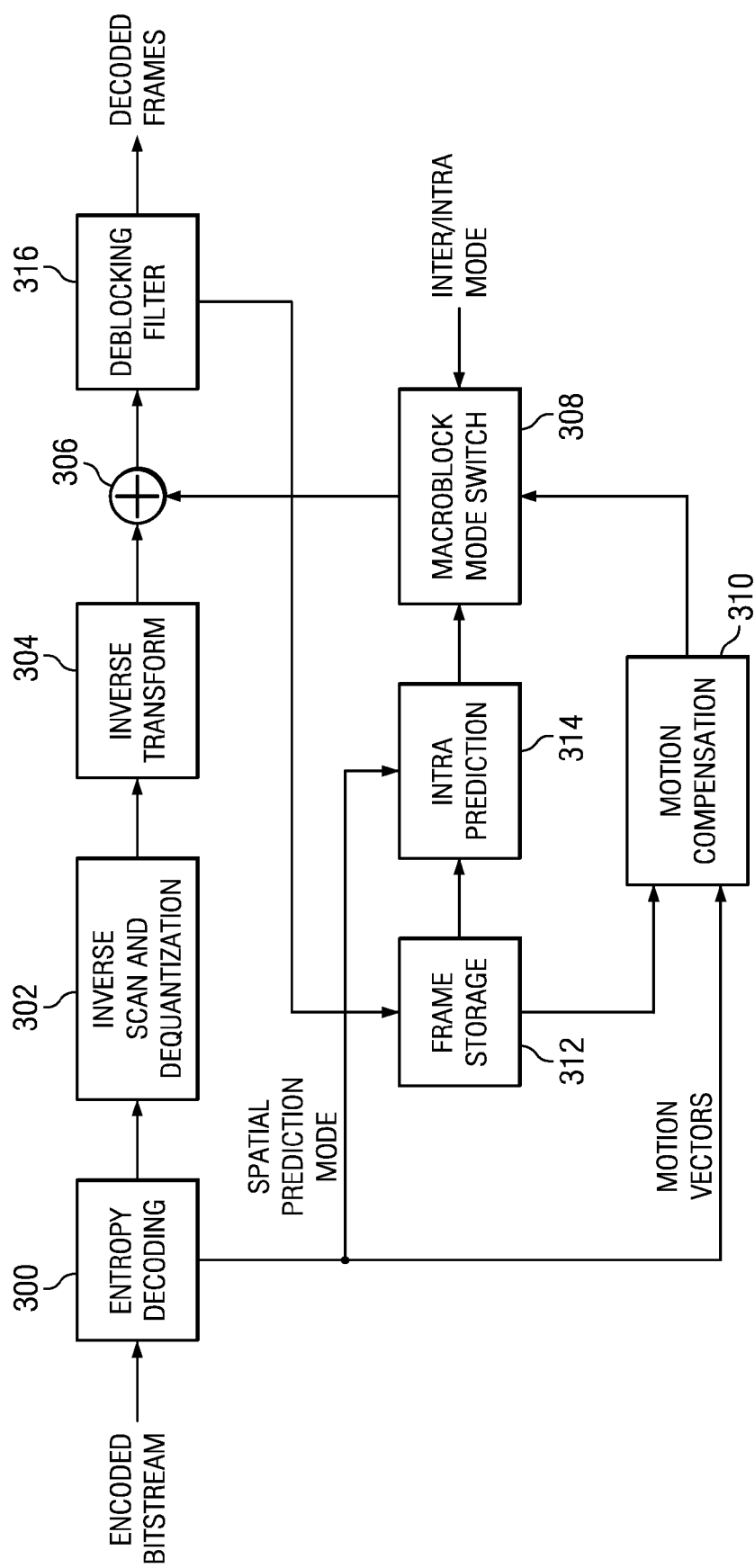
FIG. 3 shows a block diagram of a video decoder in accordance with one or more embodiments of the invention.

FIG. 3 shows a block diagram of a video decoder in accordance with one or more embodiments of the invention. More specifically, FIG. 3 shows the basic decoding architecture of an H.264 decoder. In one or more embodiments of the invention, this architecture may be implemented in hardware and/or software on the digital system of FIG. 1.

The entropy decoding component 300 receives the encoded video bitstream and recovers the symbols from the entropy encoding performed by the encoder. Error detection and recovery may be included in or after the entropy decoding. The inverse scan and dequantization component (302) assembles the macroblocks in the video bitstream in raster scan order and substantially reconstructs the frequency domain data. The inverse transform component (304) transforms the frequency domain data from inverse scan and dequantization component (302) back to the spatial domain. This spatial domain data supplies one input of the addition component (306). The other input of addition component (306) comes from the macroblock mode switch (308). When inter-prediction mode is signaled in the encoded video stream, the macroblock mode switch (308) selects the output of the motion compensation component (310). The motion compensation component (310) receives reference frames from frame storage (312) and applies the motion compensation computed by the encoder and transmitted in the encoded video bitstream. When intra-prediction mode is signaled in the encoded video stream, the macroblock mode switch (308) selects the output of the intra-prediction component (314). The intra-prediction component (314) applies the intra-prediction computed by the encoder and transmitted in the encoded video bitstream.

The addition component (306) recovers the predicted frame. The output of addition component (306) supplies the input of the deblocking filter component (316). The deblocking filter component (316) smoothes artifacts created by the block and macroblock nature of the encoding process to improve the visual quality of the decoded frame. In one or more embodiments of the invention, the deblocking filter component (316) applies a macroblock-based loop filter for regular decoding to maximize performance and applies a frame-based loop filter for frames encoded using flexible macroblock ordering (FMO) and for frames encoded using arbitrary slice order (ASO). The macroblock-based loop filter is performed after each macroblock is decoded, while the frame-based loop filter delays filtering until all macroblocks in the frame have been decoded.

More specifically, because a deblocking filter processes pixels across macroblock boundaries, the neighboring macroblocks are decoded before the filtering is applied. In some embodiments of the invention, performing the loop filter as each macroblock is decoded has the advantage of processing the pixels while they are in on-chip memory, rather than writing out pixels and reading them back in later, which consumes more power and adds delay. However, if macroblocks are decoded out of order, as with FMO or ASO, the pixels from neighboring macroblocks may not be available when the macroblock is decoded; in this case, macroblock-based loop filtering cannot be performed. For FMO or ASO, the loop filtering is delayed until after all macroblocks are decoded for the frame, and the pixels must be reread in a second pass to perform frame-based loop filtering. The output of the deblocking filter component (316) is the decoded frames of the video bitstream. Each decoded frame is stored in frame storage (312) to be used as a reference frame.

Entropy decoding block 300 contains a parallel bin decoding engine that will be described in more detail with respect to FIG. 5, which is a flow diagram illustrating operation of CABAC syntax element (SE) parsing 500 with parallel operations to produce two bins per cycle.

Figure 4:
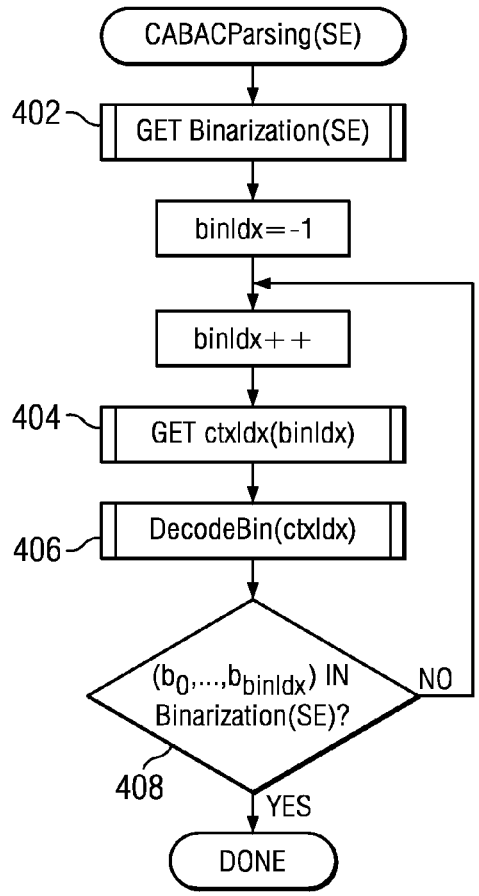
FIG. 4 is a prior art flow diagram illustrating operation of CABAC syntax element parsing.

In order to better understand the improved parallel bin decoding described herein, a prior art single bin decoding process will be briefly described with respect to FIG. 4. While the general concepts used for sequential bin decoding will be described herein, there are many detailed aspects and special cases not described herein that are used in the H.264 environment. A complete description of H.264 sequential bin decoding is contained within the H.264 standard, for example.

When parsing of a new slice is started, an initialization process is performed that determines a context index (ctxIdx) and values for variables m and n, which are provided in tables as described in more detail in H.264 section 9.3. Based on these values, a value for the most probable symbol (valMPS) and a value for a probability state index (PStateIdx) is initialized.

For each requested value of a syntax element, a binarization 402 is derived. The binarization for the syntax element and the sequence of parsed bins determines the decoding process flow. The output of this process is the binarization of the syntax element, maximum bin index for this context (maxBinIdxCtx), context index offset (ctxIdxOffset), and bypassFlag. Except for 1 slices, the binarizations for the syntax element macro block type contexts, for example, consist of bin strings given by a concatenation of prefix and suffix bit strings. Associated with each binarization or binarization part of a syntax element is a specific value of the context index offset (ctxIdxOffset) variable and a specific value of the maxBinIdxCtx variable, which are provided in Tables as defined in H.264.

For each bin of the binarization of the syntax element, which is indexed by the variable binIdx, a context index ctxIdx is derived 404, by consulting context index increment (ctxIdxInc) tables as defined by H.264 and processing the derived index increment value and index offset value.

For each ctxIdx the arithmetic decoding process 406 is invoked. The status of the arithmetic decoding engine is represented by the variables codIRange and codIOffset. In the initialization procedure of the arithmetic decoding process, codIRange is set equal to 0x01FE and codIOffset is set equal to the value returned from read_bits(9) interpreted as a 9 bit binary representation of an unsigned integer with most significant bit written first. Arithmetic coding is based on the principle of recursive interval subdivision. Given a probability estimation p(0) and p(1)=1−p(0) of a binary decision (0, 1), an initially given code sub-interval with the range codIRange will be subdivided into two sub-intervals having range p(0)*codIRange and codIRange−p(0)*codIRange, respectively. Depending on the decision, which has been observed, the corresponding sub-interval will be chosen as the new code interval, and a binary code string pointing into that interval will represent the sequence of observed binary decisions. It is useful to distinguish between the most probable symbol (MPS) and the least probable symbol (LPS), so that binary decisions may be identified as either MPS or LPS, rather than 0 or 1. Given this terminology, each context is specified by the probability pLPS of the LPS and the value of MPS (valMPS), which is either 0 or 1.

The arithmetic core engine in H.264 has three distinct properties:
the probability estimation is performed by means of a finite-state machine with a table-based transition process between 64 different representative probability states $$\{pLPS(pStateIdx)|0<=pStateIdx<64\}$$

for the LPS probability pLPS. The numbering of the states is arranged in such a way that the probability state with index pStateIdx=0 corresponds to an LPS probability value of 0.5, with decreasing LPS probability towards higher state indices;
the range codIRange representing the state of the coding engine is quantized to a small set $\{Q1, \ldots, Q4\}$ of pre-set quantization values prior to the calculation of the new interval range. Storing a table containing all 64×4 pre-computed product values of Qi*pLPS(pStateIdx) allows a multiplication-free approximation of the product codIRange*pLPS (pStateIdx);

for syntax elements or parts thereof for which an approximately uniform probability distribution is assumed to be given a separate simplified encoding and decoding bypass process is used.

The decoding process is performed by transitioning from one probability state to a next one. Depending on the decoded value binVal, the update of the two variables pStateIdx and valMPS associated with ctxIdx is derived as illustrated in Table 1. State transition rules are defined in tables as defined by H.264.

TABLE 1

Probability state update

```
if( binVal = = valMPS )
        pStateIdx = transIdxMPS( pStateIdx )
else {
        if( pStateIdx = = 0 )
                valMPS = 1 − valMPS
        pStateIdx = transIdxLPS( pStateIdx )
}
```

A renormalization process is performed in the arithmetic decoding engine 406 as decoding progresses. Inputs to this process are bits from slice data and the variables codIRange and codIOffset. Outputs of this process are the updated variables codIRange and codIOffset. The current value of codIRange is first compared to 0x0100 and further steps are specified as follows.

If codIRange is greater than or equal to 0x0100, no renormalization is needed and the RenormD process is finished;

Otherwise (codIRange is less than 0x0100), the renormalization loop is entered. Within this loop, the value of codIRange is doubled, i.e., left-shifted by 1 and a single bit is shifted into codIOffset by using read_bits(1).

The bitstream does not contain data that results in a value of codIOffset being greater than or equal to codIRange upon completion of this process.

The resulting sequence (b0 . . . bbinIdx) of parsed bins is compared 408 to the set of bin strings given by the binarization process after decoding of each bin. When the sequence matches a bin string in the given set, the corresponding value is assigned to the syntax element.

Referring again to FIG. 5, which is a flow diagram illustrating parsing of a CABAC syntax element (SE) with parallel operations to produce two bins per cycle, initialization of variable for a new slice and binarization 502 of a syntax element is performed as described earlier with respect to FIG. 4.

Figure 5:
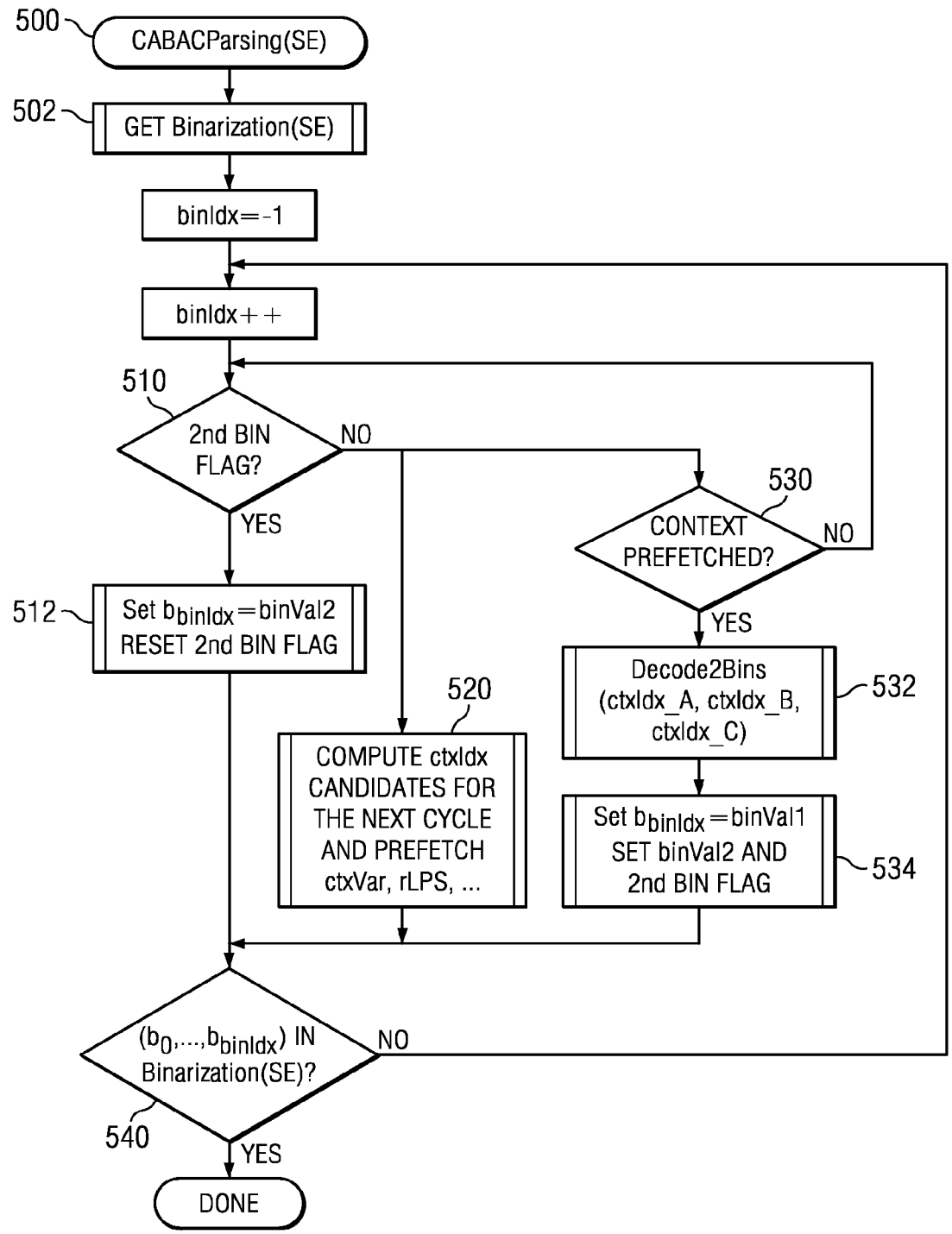
FIG. 5 is a flow diagram illustrating operation of CABAC syntax element parsing with parallel operations to produce two bins per cycle.

The first change needed in the syntax element parsing process depicted in FIG. 5 is to check 510 whether an already decoded bin is available, as indicated by second bin flag 510. If yes, then the bin decoding engine is not executed. Binarization table matching is performed 512 using the value of the second decoded bin (binVal2). When the second bin flag 510 indicates there is not an already decoded bin, then two bin decoding is executed. There are two main parallel tasks for this case. The first one is the computation 520 of context index candidates for the two bins that will be decoded in the next cycle. Context state variables (pState and MPS value) are prefetched from a context variable buffer (cache). Also, lookup table (e.g. range for LPS (rLPS), context table for LPS (tLPS), context table for MPS (tMPS), leading rLPS zeros) entry candidates to be used in the next cycle are prefetched. Decode2Bins 532 is the engine for two bins/cycle parallel CABAC decoding, and is depicted in more detail in FIG. 6. This engine uses variables that are prefetched 520 in the previous cycle to determine values of two bins (binVal1, binVal2). Updated context variables are written to cache in the Decode2bins block 532. If the context variables are not prefetched in the previous cycle, an extra cycle 530 is spent for this purpose. Binarization table matching is performed 534 using the two decoded 532 bin values (binVal1, binVal2).

Figure 6:
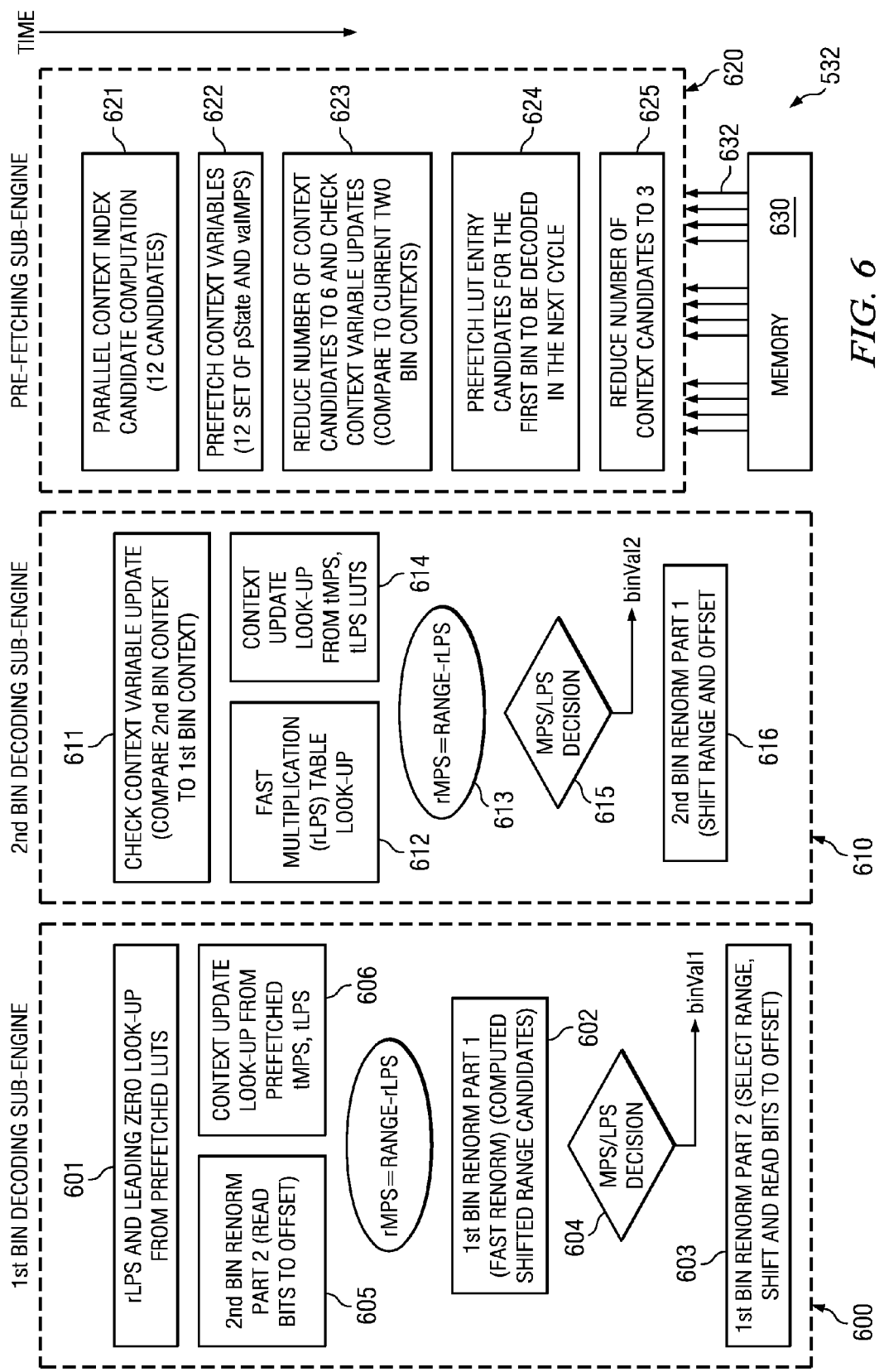
FIG. 6 is a block diagram illustrating a parallel two bin per cycle CABAC decoding engine.

FIG. 6 is a block diagram illustrating in more detail parallel two bin per cycle CABAC decoding engine 532, as first shown in FIG. 5. Parallel decoding engine 532 includes a first bin decoding sub-engine 600, a second bin decoding sub-engine 610 that operates in parallel with the first bin sub-engine, and pre-fetching sub-engine 620 that operates in parallel with both decoding sub-engines 600, 610. Recall that when referring to a context, there's the context index which refers to which context and also context state which is the value (probability) stored in the context. General concepts for the operation of the parallel decoding engine will now be described.

Prefetching Context

In order to reduce the amount of time to process the bin decoding, referred to as the critical path of the decoder, prefetching of the context state is required for the next cycle. The next context state depends on the binary symbol currently being decoded. Therefore, it is necessary to prefetch all possible contexts based on all possible binary symbol values. Then it is necessary to check that whether the current cycle is already using one of these contexts. If it is, as determined by comparing the context, it is necessary to use the updated state of the context in the next cycle.

For one bin per cycle as described with reference to FIG. 4, a single context is needed per cycle, so only one context per set is needed. There are two possible outcomes for the one bin (0 or 1) so two context candidate sets may be prefetched for the next cycle. Also, it is necessary to check if any of the context candidates are the same as the context currently being used (compare indexes). If so, and if that candidate context is selected, then the most updated state of the context should be used in the next cycle. Therefore, for one bin per cycle, the index of the two context candidates are compared with the context index of the one currently being used.

For two bins per cycle, three contexts are needed per cycle. There are four possible outcomes for the two bins (00, 01, 10, 11). Therefore, four context candidate sets are prefetched (each set with three contexts) for a total of twelve contexts. Parallel context candidate module 621 computes the twelve candidate context indexes. Prefetch module 622 prefetchs the twelve candidate context variables. A check is performed to make sure that the three contexts being used in the current cycle are not the same as the prefetched contexts by comparing indexes. If the index of the selected candidate context matches the index of either of the context updated in the current cycle, then the updated state should be used for the next cycle.

There are several options as to when these comparisons can be done:

1) Once the bins are resolved and it is known which context set to use in the next cycle, they can be compared with the context in the current cycle. This results in fewer comparisons; however, this will extend the critical path since the comparison is done AFTER the binary symbol is resolved.

2) Index comparisons can occur before any bins are resolved. This allows for more parallel processing and no increase in critical path, but there are many more comparisons. Specifically, for N bins the following index comparisons are required:

$$(1+2+4+\ldots+2^{N-1})*2N \text{ with } (1+2+4+\ldots+2^{N-1})$$

for instance, for N=2, 3*4=12 indexes are compared with 3 contexts. These comparisons can be done in parallel.

3) The comparisons can be performed before the last bin is resolved but after the other bins. This would mean it is only necessary to compare $$(1+2+4+\ldots+2^{N-1})*2 \text{ with } N.$$

So for N=2, this means 6 indexes are compared with 2 contexts.

The embodiment illustrated in FIG. 6 uses option number 3. Module 623 of prefetch sub-engine 620 reduces the number of context candidates to six and then checks the context variable updates to the two current bin contexts. The three contexts used in the current decode cycle of two bins can experience several update combinations.

Prefetching rLPS, Leading Zeros, Next States

After prefetching the context, the next dominating operation in the critical path is the least probable symbol range (rLPS) multiplication lookup table. The rLPS look up requires the state of the next context and also two bits of the range. Since the contexts are prefetched, the prefetched context state can be used to perform a partial rLPS lookup for the next cycle. A subset of the rLPS entries is prefetched by narrowing down from 256 to 4 entries. However, the updated state of the context is not known until the bin is resolved. Therefore, in order to prefetch before the bin is resolved, the rLPS based on the two possible updated states is prefetched. Note that the rLPS occurs at the same time as the leading zero lookup, the leading zeros are prefetched in the same manner.

When decoding two bins, while the first bin sub-engine 600 does the rLPS and leading zeros lookup in module 601, the second bin does the next state look up in module 611, for context A (first bin context) in case it's being used by the 2nd bin. Thus, for two bin case, the next state of the context used for the next 1st bin is also prefetched by module 624. That way the second bin can perform the partial rLPS lookup immediately.

These four pieces of data are referred to as the 'prefetch data:' rLPS, leading zero, next states_LPS (tLPS), next states_MPS (tMPS). For the one bin per cycle case, two sets of prefetch data are prefetched per candidate set.

For the multi-bin case, it is necessary to prefetch the data for the first bin in the next cycle. For 2-bin per cycle, this means that only prefetching based on the state of context A is needed. The question is when to do the prefetching of rLPS, leading zeros, and next states with respect to when the bins are resolved. If it is done before any bins are resolved, there are more context candidates and thus the larger look up tables, however there is more time. Alternatively, if delayed until after all bins are resolved, then only a small look up is needed; however, it'll extend the critical path. In this embodiment, it is done during the time before the last bin is resolved, after the context comparison. The worst case is when the index of the candidate context A matches the context of the last bin. In that case, it is not known what the updated state is so it is necessary to prefetch data for both possible states.

Effectively, between the time when the 1st bin is resolved and the 2nd bin is resolved, it is necessary to compare six context's index to the indexes of two current contexts; if the index of the candidate context A equals the context of the 2nd bin, then it is necessary to prefetch data using the two possible updated states; prefetch two data per candidate set. Otherwise, one set of data is prefetched per candidate set.

Summary of Steps for Parallel 2-Bin Decoding

1. Compute index of context candidates sets for two bins
2. Read current state of context candidates from context buffer 3. After 1st bin resolved, narrow down number of candidate sets
4. Compare index of all candidates with index of previous unresolved bin contexts, if context index matches, then the latest updated context state should be used instead Parallel Decoding Engine Options Various embodiments of a parallel bin decoder may include various option logic modules to reduce the critical path at the expense of increased complexity. Tradeoffs may be made based on required performance level and cost. Some embodiments of the invention may include all of the options described below for maximum performance; while others may include a subset of the options and operate at a lower clock rate due to a longer critical path.

Option 1: Parallelization in Context Index Computation

As described above, module 621 simultaneously computes context index candidates for two bins to be decoded in the next cycle. Up to twelve possible contexts are computed. In an embodiment that does not do prefetching, then only three context indices need to be computed, one for the first bin and two for the second bin; however, in order to prefetch contexts for the next cycle, then twelve context indices must be computed since the value of both the first bin and the second bin are currently unknown and there are four possible outcomes for the current two bins.

Option 2: Prefetching Context Variables

Module 622 prefetches twelve possible context variable candidates from a multiport cache memory 630 coupled by multiple parallel data paths 632 to decoding engine 532 for the next cycle before decoding is complete in the current cycle.

Option 3: Fast Multiplication Look-Up-Table (LUT)

The multiplication LUT for the second bin requires the "Range" information produced after the renormalization block 603 of the first bin. Therefore it is challenging to parallelize two multiplication LUTs. It has been observed that the only the first two bits of the "Range" variable and two possible context variables of the second bin are used in accessing the LUT table. Therefore there are only eight ((00, 01, 10, 11)×2) possible inputs to the second bin LUT. Based on this observation, a second bin LUT is pre-computed for the eight possible cases in module 612. In this manner, the look up table is reduced in size from 256 entries to only eight entries. The size of the pre-computed M-LUT table is reduced further to two using two possible renormalized range values of the first bin sub-engine. The final multiplication LUT output for the second bin is selected from these two possible candidates once the first bin is resolved by module 604.

Option 4: Fast Renormalization

Module 602 computes and passes the renormalized range to the 2nd bin decoding sub-engine before the 1st bin "Offset<rMPS" comparison. Since the outcome of the first bin is not yet known, both possible range renormalization results are precomputed in module 602. As described above in more detail, in traditional renormalization procedure the range is shifted when its value is less than 0x0100 and the offset is shifted with an additional bit(s) from the input data stream shifted into the offset. This technique enables the 2nd bin engine to perform the rLPS multiplication table look up in module 612 and to compute the next range of the MPS (rMPS) in module 613 before the 1st bin is resolved by module 604. The rMPS is computed as:

rMPS=range−rLPS.

Option 5: Shift the Bit-Stream in Parallel with Multiplication LUT

Offset renormalization occurs at end of cycle; however, the bit-stream can be shifted (updated) at the beginning of the next cycle in module 605 by shifting in additional offset bits from the bitstream to match the amount the range was shifted in module 616. Module 616 computes the amount of shift that is needed using a leading zeros table, and then shifts the range and offset by that amount in one shift cycle, rather than in the iterative fashion described in the H.264 standard. In other words, in bitstream control, perform muxing of a window of data for shifting bits into the offset in the next cycle.

Option 6: Check Context Updates During the Context Models Pre-Fetching

The pre-fetched context indices need to be compared with the current context indices to see if updated states should be used in next cycle. This comparison may be performed by module 614 before the 2nd bin is resolved by module 615. If the next cycle of decoding two bins will be using the same context as the current cycle, the context needs to be updated before being used in the next cycle to reflect the results of the current decoding cycle. A complication is that twelve contexts were prefetched. In one embodiment, sufficient comparison logic may be provided to compare and update all twelve contexts in parallel. In another embodiment, module 614 can wait until the first bin is resolved by module 604 which will reduce the number of viable prefetched contexts to six, in which case module 614 includes resources to compare six context indices and to update the six viable prefetched contexts from the tMPS and tLPS look up tables.

Option 7: Prefetching LUT Entries (rLPS, Leading Zeros and Next State)

The rLPS look up requires the state of the next context and also two bits of the range. Since the four possible contexts for the first bin in the next cycle are being prefetched, the prefetched context state may be used to perform a partial rLPS lookup for the next cycle by module 606. A subset of the rLPS, the tMPS and tLPS next state tables and the leading zero table entries are speculatively prefetched in the current cycle to be used decoding the first bin in the next cycle. In an embodiment that prefetches the LUT entries before the first bin of the current cycle is decoded, four sets of table entries need to be prefetched. For an embodiment that prefetches the LUT entries after the first bin of the current cycle is decoded only two sets of table entries need to be prefetched. The rLPS, tMPS and tLPS prefetched LUT entries are used for reducing the multiplication table size that is needed for decoding the first bin of the next cycle by module 624. The leading zero table prefetch is used by module 616 for the fast renormalization shift.

Module 625 receives the resolved second bin value and culls out three more context candidates based on the resolved second bin value, leaving one context for the first bin and two context candidates for the second bin to be used in the next cycle Note that while the implementation described with regard to FIG. 6 addresses the CABAC engine in H.264, this same approach can be applied to other standards such as SVC, MVC, China AVS, etc.

Figure 7:
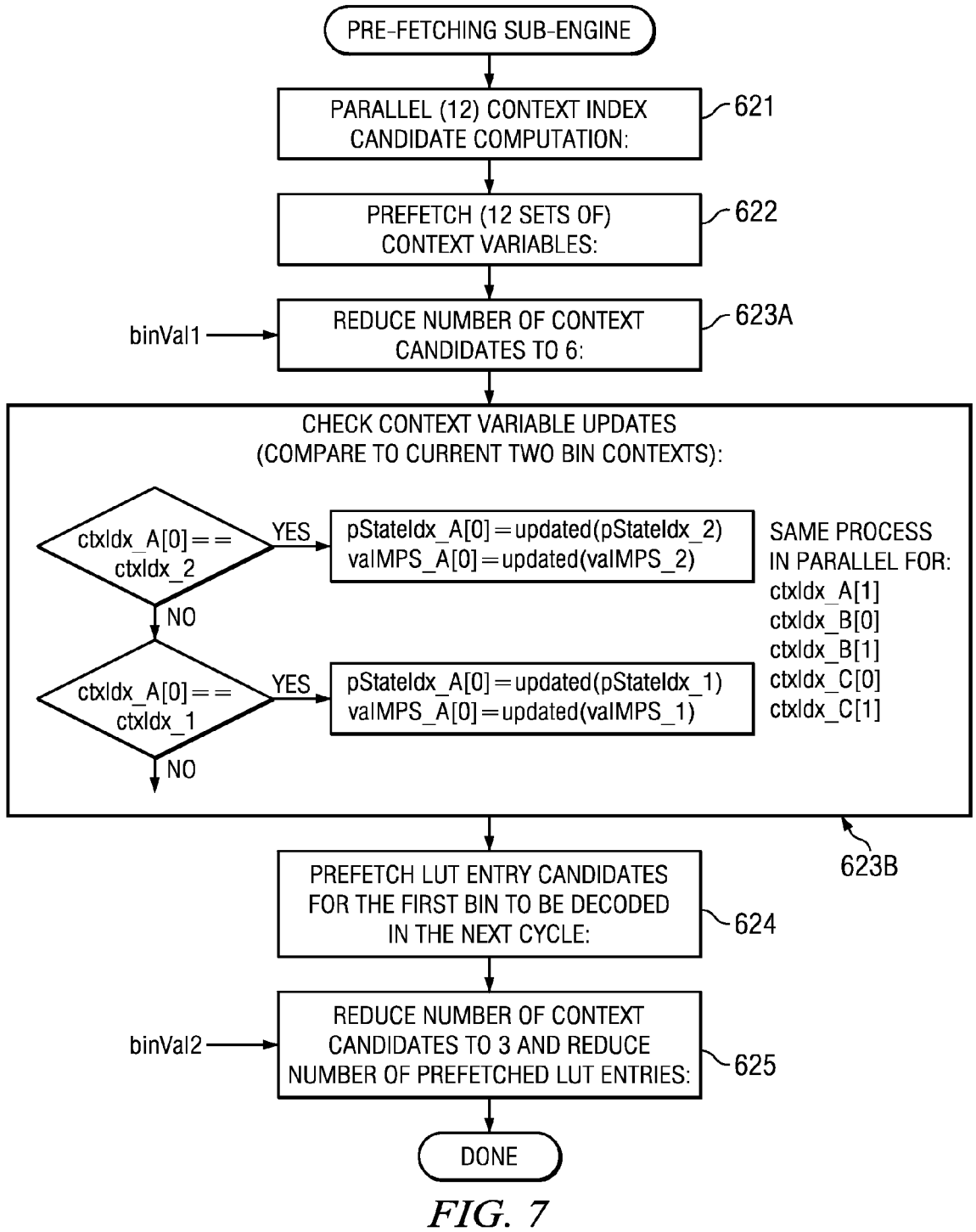
FIG. 7 is a more detailed block diagram of the prefetching sub-engine of FIG. 6.

FIG. 7 is a more detailed block diagram of the prefetching sub-engine of FIG. 6. Terminology used in FIG. 7 and FIGS. 8A-8C is defined in Table 2.

TABLE 2

| Terminology |
|---|
| CABAC: Context-adaptive binary arithmetic coding |
| ctxIdx_?: Context index |

TABLE 2-continued

Terminology $2^8 \leq \text{Range}(R) \leq 2^9-2$, represented with 9 bits.
Offset value ($0 \leq O \leq 2^9-1$) represented by 9 bits.
Context variables:
    a. probability state ($0 \leq \text{pStateIdx}\_? \leq 2^6-1$), 6 bits
    b. MPS value (valMPS_? = {0,1}), 1 bit
binVal?: Output bin value (1-bit)
rLPS[4] [64]: LPS range computation look-up table
tLPS[64], tMPS[64]: probability state transition tables
LZ_rLPS[4] [64]: look-up table containing number of leading zeros of rLPS look-up table entries The modules in FIG. 7 are the same as the equivalent numbered modules in FIG. 6. Module 621 computes twelve context index candidates using twelve computing modules in a parallel manner, as follows:

ctxIdx_A[0:1] [0:1]
ctxIdx_B[0:1] [0:1]
ctxIdx_C[0:1] [0:1]

The resulting twelve context indices are used by module 622 to perform a parallel prefetch into a memory module coupled to the prefetch sub-engine that has twelve access ports to allow all twelve context variables to be fetched in parallel, as follows:

pStateIdx_A[0:1] [0:1], valMPS_A[0:1] [0:1]
pStateIdx_A[0:1] [0:1], valMPS_A[0:1] [0:1]
pStateIdx_A[0:1] [0:1], valMPS_A[0:1] [0:1]

After receiving the resolved binVal1, module 623A culls out the six context variables that are no longer needed, as shown in Table 3.

TABLE 3

Reduce number of context candidates to six ctxIdx_A[0:1] = ctxIdx_A[binVal1] [0:1],
pStateIdx_A[0:1] = pStateIdx_A[binVal1] [0:1],
valMPS_A[0:1] = valMPS_A[binVal1] [0:1]
ctxIdx_B[0:1] = ctxIdx_B[binVal1] [0:1],
pStateIdx_B[0:1] = pStateIdx_B[binVal1] [0:1],
valMPS_B[0:1] = valMPS_B[binVal1] [0:1]
ctxIdx_C[0:1] = ctxIdx_C[binVal1] [0:1],
pStateIdx_C[0:1] = pStateIdx_C[binVal1] [0:1],
valMPS_C[0:1] = valMPS_C[binVal1] [0:1]

Module 623B compares compare the remaining six prefetched context variables to the current two bin contexts and updates them to reflect the current state if they are the same context index.

Module 624 prefetches the LUT entry candidates for the first bin to be decoded in the next cycle, as illustrated in Table 4.

TABLE 4

Prefetch LUT entry candidates for the first bin to be decoded in the next cycle prefetched_rLPS[0:1] [0:3] = rLPS[pStateIdx_A[0:1]] [0:3]
prefetched_LZ_rLPS[0:1] [0:3] = LZ_rLPS[pStateIdx_A[0:1]] [0:3

TABLE 4-continued

Prefetch LUT entry candidates for the first bin to be decoded in the next cycle prefetched_tMPS[0:1] = tMPS[pStateIdx_A[0:1]]
prefetched_tLPS[0:1] = tLPS[pStateIdx_A[0:1]]

Module 625 receives the resolved second bin value and culls out three more context candidates based on the resolved second bin value, leaving one context for the first bin and two context candidates for the second bin to be used in the next cycle, as shown in Table 5.

TABLE 5

Reduce number of context candidates to 3 and reduce number of prefetched LUT entries:

ctxIdx_A = ctxIdx_A[binVal2],
pStateIdx_A = pStateIdx_A[binVal2],
valMPS_A = valMPS_A[binVal2]
ctxIdx_B = ctxIdx_B[binVal2],
pStateIdx_B = pStateIdx_B[binVal2],
valMPS_B = valMPS_A[binVal2]
ctxIdx_C = ctxIdx_C[binVal2],
pStateIdx_C = pStateIdx_C[binVal2],
valMPS_C = valMPS_C[binVal2]
prefetched_rLPS[0:3] = rLPS[pStateIdx_A[binVal2]] [0:3],
prefetched_LZ_rLPS[0:3] = LZ_rLPS[binVal2] [0:3]
prefetched_tMPS = tMPS[binVal2],
prefetched_tLPS = tLPS[binVal2]

Figure 8A:
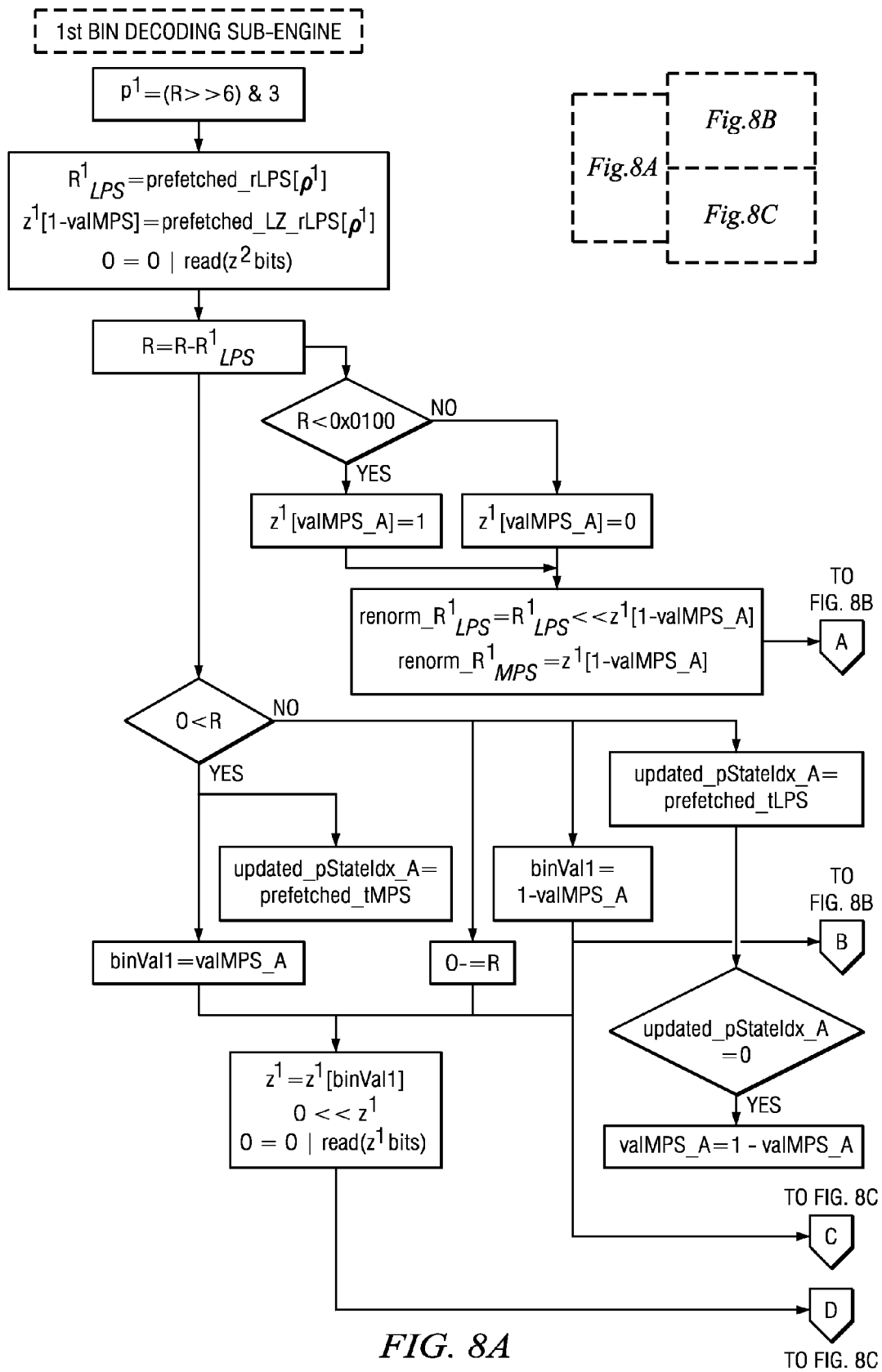
FIG. 8A-8C together is a more detailed block diagram of the first and second bin decoding sub-engines of FIG. 6.
Figure 8B:
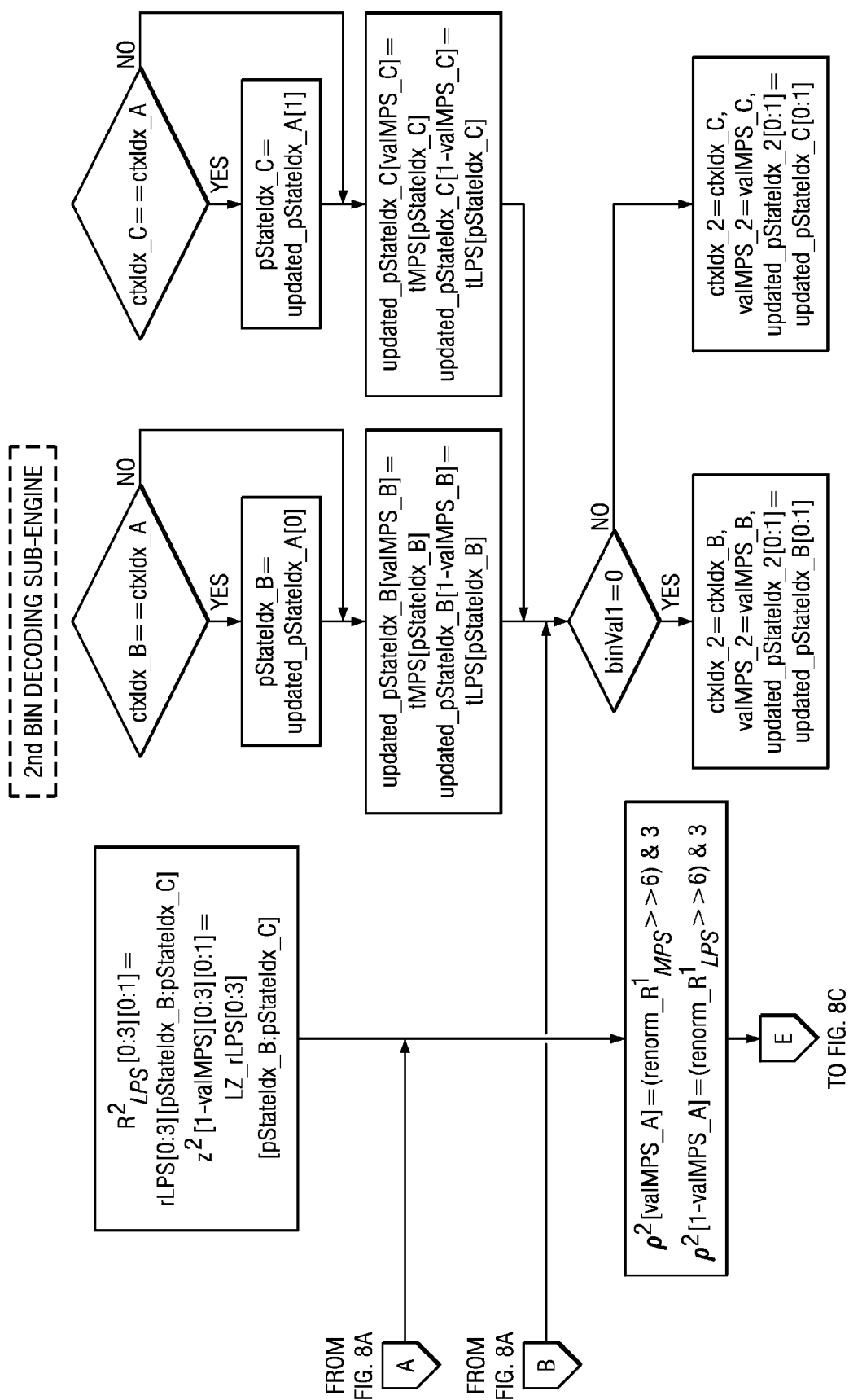
Figure 8C:
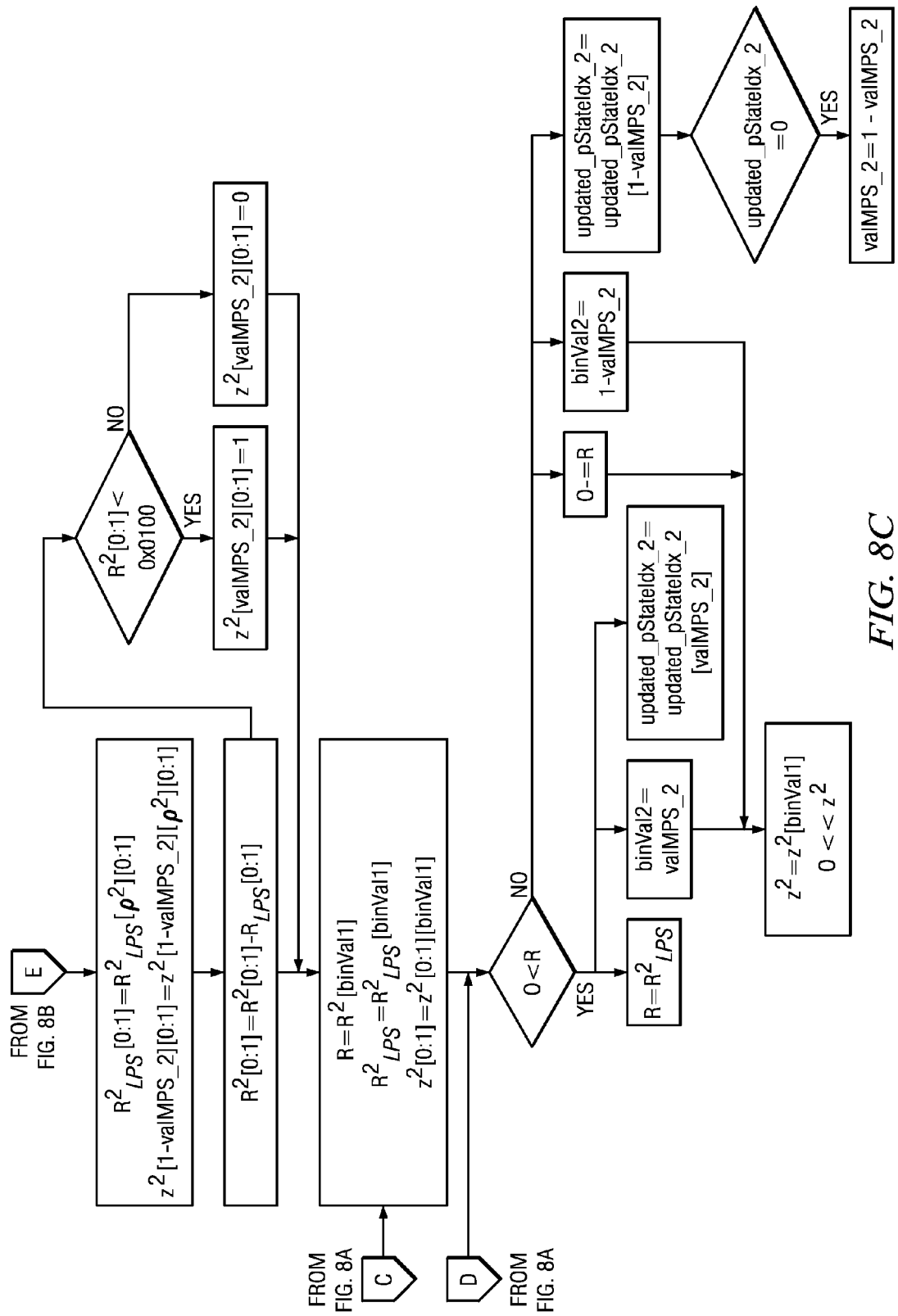

FIG. 8A-8C together is a more detailed block diagram of the first and second bin decoding sub-engines of FIG. 6. FIG. 8A-8C illustrates the control flow in more detail that is described above with respect to FIG. 6.

System Embodiments

Figure 9:
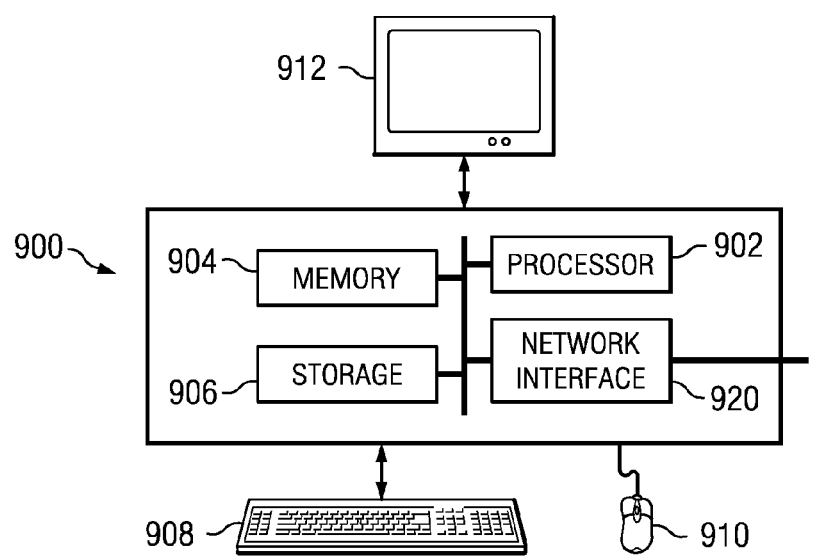
FIGS. 9 and 10 show illustrative digital systems in accordance with one or more embodiments of the invention.

FIG. 9 shows a digital system (900) (e.g., a personal computer) that includes a processor (902), associated memory (904), a storage device (906), and numerous other elements and functionalities typical of digital systems (not shown). In one or more embodiments of the invention, a digital system may include multiple processors and/or one or more of the processors may be digital signal processors. The digital system (900) may also include input means, such as a keyboard (908) and a mouse (910) (or other cursor control device), and output means, such as a monitor (912) (or other display device). The digital system (900) may also include an image capture device (not shown) that includes circuitry (e.g., optics, a sensor, readout electronics) for capturing video sequences. The digital system (900) may be connected to a network (914) (e.g., a local area network (LAN), a wide area network (WAN) such as the Internet, a cellular network, any other similar type of network and/or any combination thereof) via a network interface connection 920. Video image data may be received via the network. Those skilled in the art will appreciate that these input and output means may take other forms.

Processor 902 may include a video decoder that includes a parallel bin decoding engine as described in more detail above. The video decoder may be configured to decode video image data received over the network or from storage media coupled to storage module 906. Processor 902 may be further configured to display the decoded video data stream, such as a movie or other type of video images, on monitor 912.

Further, those skilled in the art will appreciate that one or more elements of the aforementioned digital system (900) may be located at a remote location and connected to the other elements over a network. Further, embodiments of the invention may be implemented on a distributed system having a plurality of nodes, where each portion of the system and software instructions may be located on a different node within the distributed system. In one embodiment of the invention, the node may be a digital system. Alternatively, the node may be a processor with associated physical memory. The node may alternatively be a processor with shared memory and/or resources.

Software instructions to perform embodiments of the invention may be stored on a computer readable medium such as a compact disc (CD), a diskette, a tape, a file, or any other computer readable storage device. The software instructions may be distributed to the digital system (900) via removable memory (e.g., floppy disk, optical disk, flash memory, USB key), via a transmission path, etc.

Figure 10:
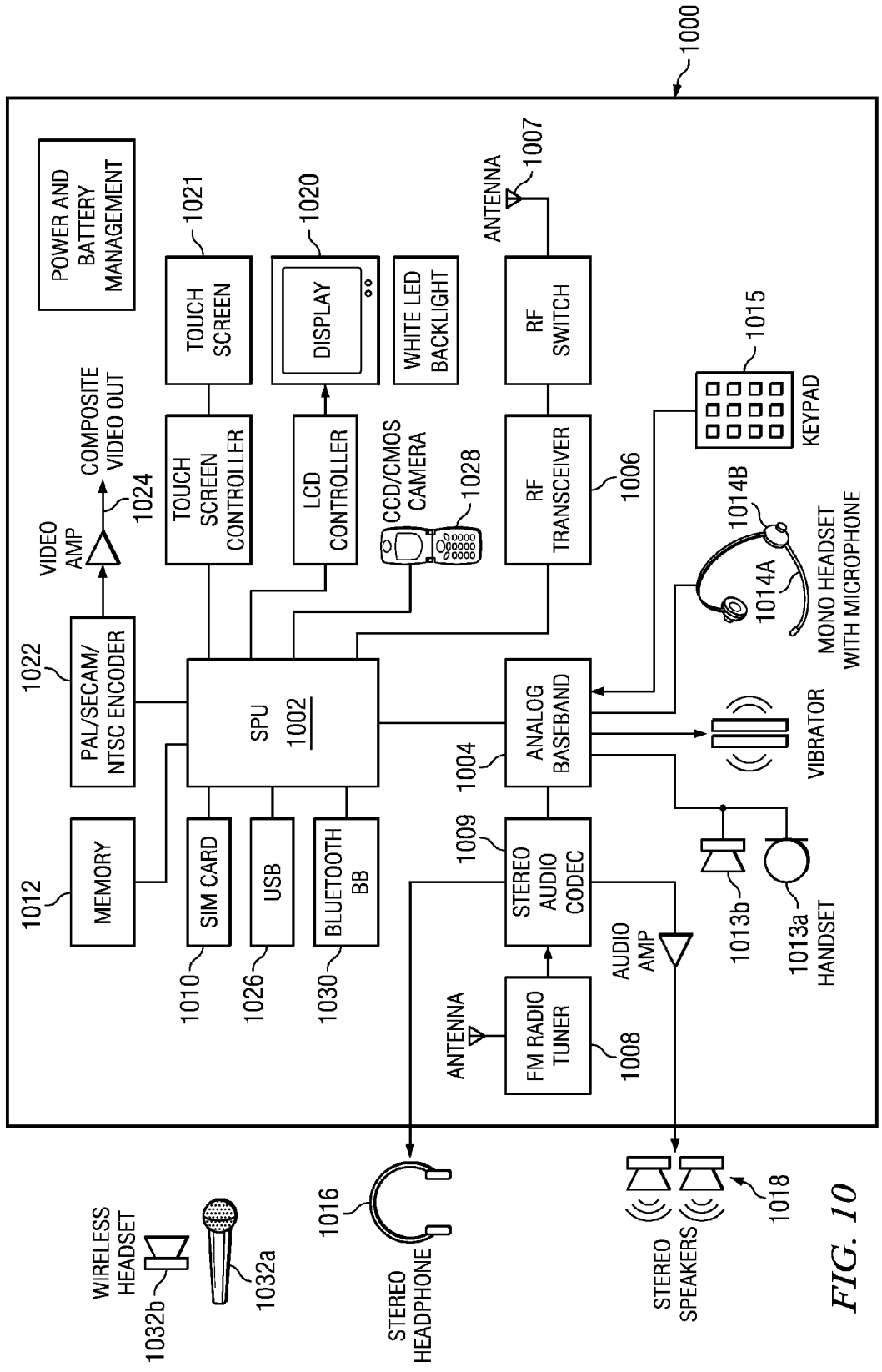

FIG. 10 is a block diagram of a digital system (e.g., a mobile cellular telephone) (1000) that may be configured to perform the methods described herein. The signal processing unit (SPU) (1002) includes a digital processing processor system (DSP) that includes embedded memory and security features. The analog baseband unit (1004) receives a voice data stream from handset microphone (1013a) and sends a voice data stream to the handset mono speaker (1013b). The analog baseband unit (1004) also receives a voice data stream from the microphone (1014a) and sends a voice data stream to the mono headset (1014b). The analog baseband unit (1004) and the SPU (1002) may be separate ICs. In many embodiments, the analog baseband unit (1004) does not embed a programmable processor core, but performs processing based on configuration of audio paths, filters, gains, etc being setup by software running on the SPU (1002). In some embodiments, the analog baseband processing is performed on the same processor and can send information to it for interaction with a user of the digital system (1000) during a call processing or other processing.

The display (1020) may also display pictures and video streams received from the network, from a local camera (1028), or from other sources such as the USB (1026) or the memory (1012). The SPU (1002) may also send a video stream to the display (1020) that is received from various sources such as the cellular network via the RF transceiver (1006) or the camera (1028). The SPU (1002) may also send a video stream to an external video display unit via the encoder (1022) over a composite output terminal (1024). The encoder unit (1022) may provide encoding according to PAL/SECAM/NTSC video standards.

The SPU (1002) includes functionality to perform the computational operations required for video decompression. The video compression standards supported may include, for example, one or more of the JPEG standards, the MPEG standards, and the H.26x standards. In one or more embodiments of the invention, the SPU (1002) is configured to perform the computational operations of one or more of the methods described herein. A parallel bin decoder module is included within SPU 1002 to improve decoding performance, as described in more detail above. Software instructions implementing aspects of the methods may be stored in the memory (1012) and executed by the SPU (1002) during decoding of video sequences.

Other Embodiments

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

Embodiments of the decoders and methods described herein may be provided on any of several types of digital systems: digital signal processors (DSPs), general purpose programmable processors, application specific circuits, or systems on a chip (SoC) such as combinations of a DSP and a reduced instruction set (RISC) processor together with various specialized accelerators. A stored program in an onboard or external (flash EEP) ROM or FRAM may be used to implement aspects of the video signal processing. Analog-to-digital converters and digital-to-analog converters provide coupling to the real world, modulators and demodulators (plus antennas for air interfaces) can provide coupling for waveform reception of video data being broadcast over the air by satellite, TV stations, cellular networks, etc or via wired networks such as the Internet.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Embodiments of the methods and video decoders for performing parallel bin decoding as described herein may be implemented for virtually any type of digital system (e.g., a desk top computer, a laptop computer, a set-top box for satellite or cable, a handheld device such as a mobile (i.e., cellular) phone, a personal digital assistant, a digital camera, etc.) with functionality to decode digital video images.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for decoding compressed video, the method comprising:

receiving a data stream comprising a sequence of syntax elements that were compressed using context-adaptive binary arithmetic coding (CABAC), such that the encoding of each bin of a bin string representative of a syntax element was performed by arithmetic encoding; and decoding two consecutive bins in parallel, wherein speculatively decoding a set of possible values for a second one of the two bins while decoding a first one of the two bins, and selecting a final value for the second bin from the set of possible values when the value of the first bin is determined.

2. The method of claim 1, wherein decoding two consecutive bins comprises computing in a current cycle a set of possible context index candidates for two bins to be decoded in a next cycle.

3. The method of claim 2, wherein the set of possible context index candidates comprises twelve context indices.

4. The method of claim 2, wherein decoding two consecutive bins further comprises prefetching the set of possible context variable candidates for use in the next cycle before decoding is complete in the current cycle.

5. The method of claim 2, wherein decoding two consecutive bins further comprises:

comparing a portion of the set of possible context index candidates for the next cycle to context indices being used for decoding the two bins in the current cycle after the first bin is resolved but before the second bin is resolved; and updating the portion of the set of possible context index candidates by accessing corresponding context table entries prior to resolving the second bin.

6. The method of claim 2, wherein decoding two consecutive bins further comprises:

comparing the set of possible context index candidates for the next cycle to context indices being used for decoding the second bin in the current cycle before the first and the second bin is resolved; and updating the set of possible context index candidates by accessing corresponding context table entries prior to resolving the second bin.

7. The method of claim 2, wherein decoding two consecutive bins further comprises prefetching during the current cycle entries from look up tables for use during the next cycle corresponding the set of possible context index candidates.

8. The method of claim 1, wherein decoding two consecutive bins further comprises:

pre-computing a reduced M-LUT for the second bin by accessing eight locations of a multiplication LUT using four possible combinations of most significant two bits of the range variable and two possible context variable states of the second bin;

reducing the size of the pre-computed M-LUT table further to two using two possible renormalized range values of the first bin sub-engine; and decoding the second bin using the reduced M-LUT after the first bin is resolved.

9. The method of claim 1, wherein decoding two consecutive bins further comprises:

determining a range value for the first bin;

pre-computing a set of possible range renormalization results for the second bin before the first bin is resolved;

accessing an entry in a multiplication look up table (M-LUT) using each of the set of possible range renormalization results; and selecting a correct range renormalization result from the set of possible range renormalization results after the first bin is resolved.

10. The method of claim 1, wherein decoding two consecutive bins further comprises:

determining during the current cycle an amount of shift required to renormalize the range and offset after resolving the second bin; and reading an number of bits corresponding to the shift amount from the data stream and shifting them into the offset value during the next cycle.

11. The method of claim 10, further comprising shifting the range by the amount of shift in a single operation.

12. A digital system comprising a video decoder configured to decode a sequence of syntax elements that were compressed using context-adaptive binary arithmetic coding (CABAC), such that the encoding of each bin of a bin string representative of a syntax element was performed by arithmetic encoding; wherein the video decoder comprises:

a first bin decoding sub-engine;

a second bin decoding sub-engine coupled to operate in parallel with the first bin decoding sub-engine, such that two consecutive bins of a syntax element are decoded in parallel; and a prefetching sub-engine coupled to the first bin decoding sub-engine and to the second bin decoding sub-engine.

13. The digital system of claim 12, wherein the second bin decoding sub-engine is configured to speculatively decode a set of possible values for a second one of the two bins while the first bin decoding sub-engine is decoding a first one of the two bins; and wherein the second bin decoding engine is configured to select a final value for the second bin from the set of possible values when the value of the first bin is determined.

14. The digital system of claim 12, wherein the video decoder further comprises a multiport memory module coupled to the prefetching sub-engine by a plurality of parallel data paths.

15. The digital system of claim 14, wherein the prefetching sub-engine further comprises a plurality of parallel computation engines, the parallel computation engines configured to compute in a current cycle a set of possible context index candidates for two bins to be decoded in a next cycle.

16. The digital system of claim 15, wherein the prefetching sub-engine is further configured to prefetch the set of possible context variable candidates from the memory module for use in the next cycle before decoding is complete in the current cycle.

17. The digital system of claim 15, wherein the prefetching sub-engine is further configured to:

compare the set of possible context index candidates for the next cycle to context indices being used for decoding the second bin in the current cycle before the first and the second bin is resolved; and update the set of possible context index candidates by accessing corresponding context table entries prior to resolving the second bin.

18. The digital system of claim 12, wherein the second bin decoding sub-engine is further configured to:

pre-compute a reduced M-LUT for the second bin by accessing eight locations of a multiplication LUT using four possible combinations of most significant two bits of the range variable and two possible context variable states of the second bin;

reduce the size of the pre-computed M-LUT table further to two using two possible renormalized range values of the first bin sub-engine; and decode the second bin using the reduced M-LUT after the first bin is resolved.

19. The digital system of claim 12, wherein the second bin decoding sub-engine is further configured to:

pre-compute a set of possible range renormalization results for the second bin before the first bin is resolved;

access an entry in a multiplication look up table (M-LUT) using each of the set of possible range renormalization results; and select a correct range renormalization result from the set of possible range renormalization results after the first bin is resolved.

* * * * *